(12) United States Patent
Lee et al.

(10) Patent No.: US 6,372,555 B1
(45) Date of Patent: Apr. 16, 2002

(54) SEMICONDUCTOR INTEGRATED CIRCUIT DEVICE AND METHOD OF MANUFACTURING THE SAME

(75) Inventors: Seung-Jae Lee; Tae-Wook Seo, both of Suwon-shi; Sun-Hoo Park, Yongin-shi, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/399,926

(22) Filed: Sep. 21, 1999

(30) Foreign Application Priority Data

Sep. 21, 1998 (KR) .............................................. 98-39057

(51) Int. Cl.$^7$ ............................................... H01L 21/82
(52) U.S. Cl. ........................ 438/132; 438/601; 438/637
(58) Field of Search .......................... 257/529; 438/132, 438/215, 281, 333, 637, 668, 601

(56) References Cited

U.S. PATENT DOCUMENTS

| | | | |
|---|---|---|---|
| 5,025,300 A | * 6/1991 | Billig et al. | ................. 257/529 |
| 5,444,012 A | * 8/1995 | Yoshizumi et al. | ......... 438/601 |
| 6,074,940 A | * 6/2000 | Lee et al. | ................... 438/601 |
| 6,162,686 A | * 12/2000 | Huang et al. | ............... 438/281 |

OTHER PUBLICATIONS

Wolf, Stanley, Silicon Processing for the VLSI Era, Lattice Press, 1986, pp 521–23.*

* cited by examiner

Primary Examiner—Sara Crane
(74) Attorney, Agent, or Firm—Marger Johnson & McCollom, P.C.

(57) ABSTRACT

A novel fuse structure for a semiconductor integrated circuit device and the method of manufacturing the semiconductor integrated circuit device is disclosed. The fuse structure is comprised of a first interconnection metal layer formed on a semiconductor substrate; an inter-metal dielectric layer formed on the first interconnection metal layer having a via exposing the first interconnection metal layer; a via plug filling up the via; a metal layer for a fuse and a second interconnection metal layer consecutively deposited on the via plug and the inter-metal dielectric layer; and an opening area exposing the metal layer for a fuse is positioned more than twice the thickness of the second interconnection metal layer from the via. With the present invention, a contact failure which can result from a damage to via plug in a subsequent stripping step can be prevented. Also, a passivation layer formed after opening the fuse area prevents a short-circuit between adjacent fuses in a subsequent laser repairing process.

10 Claims, 5 Drawing Sheets

SEMICONDUCTOR INTEGRATED CIRCUIT DEVICE AND METHOD OF MANUFACTURING THE SAME

BACKGROUND OF THE INVENTION

1. Field of the Invention

The present invention relates generally to a semiconductor integrated circuit device and a method of manufacturing the same, and more particularly to a semiconductor integrated circuit device and a method of manufacturing the same in which via plug corrosion can be prevented by allowing a sufficient distance between a fuse opening area and a via plug.

2. Description of the Related Art

Generally, semiconductor manufacturing processes include a fabrication process (hereinafter called FAB process), an electrical die sorting process (hereinafter called EDS process), an assembly process and a test process, and are explained as follows.

During the FAB process, fully functional electrical circuits on a semiconductor wafer are attained by repeated processes of diffusion, photolithography, etching and thin film formation. After etching of a passivation layer, the final step in FAB process, the EDS process is being performed. The EDS process determines whether each chip on the semiconductor wafer is good or bad by an electrical test that includes a pre-laser test step which detects a defective chip and generates corresponding data, a laser repairing step which repairs the defective chip by a laser beam according to the data, a post-laser test step which selectively checks the repaired chip and a back-grinding step which grinds backside of a fabricated wafer with a diamond wheel.

During the laser repairing process, a defective memory cell is repaired by cutting a fuse which is connected to the defective memory cell using a laser beam and substituting a redundant memory cell in a chip for the defective memory cell. The fuse is also used to activate a redundant memory cell for substituting a defective memory cell.

In a conventional memory redundancy technology, a fuse, consisting of polysilicon or a silicide, is formed as a part of an interconnection layer on a field oxide. At present, RC delay in a chip becomes a major factor determining the chip performance speed with increasing density of semiconductor devices and the resulting strict design rule. Accordingly, a multi-layer interconnection structure and a fuse technology, in which a part of the uppermost layer is used as a fuse, are utilized.

FIG. 1 is a plan view illustrating a fuse area in a conventional semiconductor device. FIG. 2 and FIG. 3 are cross sectional views taken along line A–A' in FIG. 1 illustrating a conventional method of forming a fuse in a semiconductor integrated circuit device.

Referring to FIG. 2, after depositing aluminium (Al) on an insulation layer (not shown) formed on a semiconductor substrate (not shown) in which a certain configuration of circuits is formed, a lower interconnection metal layer (12) is formed by patterning the aluminium layer by a photo-etching method. Subsequently, a first barrier metal layer (14) composed of a titanium (Ti) layer and a titanium nitride (TiN) layer is formed. After forming an inter-metal dielectric layer (16), which is formed of an insulation material such as an oxide, on the first barrier metal layer (14), a via (18) exposing a portion of surface of the lower interconnection metal layer (12) is formed by patterning the inter-metal dielectric layer (16). Thereafter, a metal layer, such as a tungsten (W) layer, is deposited thick enough to fill up the via (18) by chemical vapor deposition (CVD). Then, such a tungsten (W) layer is polished by chemical mechanical polishing (CMP) until the inter-metal dielectric layer (16) is exposed so as to form a metal plug such as tungsten (W) plug (20) filling up the via (18).

A second barrier metal layer (22) is formed by depositing a titanium (Ti) layer to a thickness of about 150 Å, and a titanium nitride (TiN) layer to a thickness of about 650 Å, consecutively by sputtering or chemical vapor deposition (CVD) method on the inter-metal dielectric layer (16) and the tungsten plug (20). The second barrier metal layer (22) prevents an unwanted reaction between tungsten (W) and aluminium (Al). And a fuse is formed by exposing the surface of the second barrier metal layer (22) at a certain area.

After depositing an aluminium (Al) layer to a thickness of about 6000 Å on the second barrier metal layer (22), an upper interconnection metal layer (24) is formed by patterning the aluminium layer by photo-etching. An oxide deposited on the second barrier metal layer by a plasma enhanced chemical vapor deposition (PECVD) method functions as a first passivation layer (26). A second passivation layer (28) is formed by depositing silicon nitride ($Si_3N_4$) on the first passivation layer (26) by plasma enhanced chemical vapor deposition (PECVD).

Subsequently, the second passivation layer (28) and first passivation layer (26) are dry etched so as to define a fuse opening area (30) as illustrated in FIG. 1.

Referring to FIG. 3, the fuse area of the second barrier metal layer (22) is exposed by chemical etching, using a chemical etchant having a selectivity between the second barrier metal layer (22) and the upper interconnection metal layer (24) and the patterned second and first passivation layer (28,26) as an etching mask. At this time, the upper interconnection metal layer (24) under the first passivation layer (26) is also etched. Particularly, the thicker the interconnection metal layer (24) is, the more the interconnection metal layer under the first passivation layer is etched. Accordingly, if the distance (d1 in FIG. 1) between the fuse opening area (30) and the via (18) is short, tungsten plug (20) filling up the via (18) can be exposed.

As above, if photolithography step for forming a pad is performed with tungsten plug being exposed, charges are accumulated at the exposed tungsten plug during the ashing step using oxygen plasma. Consequently, the tungsten plug is corroded due to a strong electrochemical reaction at the surface of the tungsten plug when the tungsten plug is exposed to an organic stripper in a subsequent wet strip process. In worst case, all the tungsten plug (20) in the bottom portion of the via (18) can be in a chemical solution, which can lead to a contact failure.

SUMMARY OF THE INVENTION

It is, therefore, an object of the present invention to provide a semiconductor integrated circuit device in which a via plug is not exposed during the step of opening a fuse area such that the corrosion of the via plug can be prevented.

It is another object of the present invention to provide a semiconductor integrated circuit device manufacturing method by which a via plug is not exposed in the step of opening a fuse area so as to prevent the corrosion of the via plug.

The first object is accomplished by the semiconductor integrated circuit device characterized in comprising a first interconnection metal layer formed on a semiconductor substrate; an inter-metal dielectric layer formed on the first interconnection metal layer having a via exposing the first interconnection metal layer; a via plug filling up the via; a metal layer for a fuse and a second interconnection metal layer consecutively formed on the via plug and the inter-metal dielectric layer. According to the present invention, a fuse opening area that exposes the metal layer for a fuse is positioned more than twice the thickness of the second interconnection metal layer from the via.

Preferably, a first passivation layer which exposes the fuse is formed on the second interconnection metal layer.

Preferably, a second passivation layer is formed on the first passivation layer.

Preferably, the second passivation layer encloses the first passivation layer, the second interconnection metal layer, the metal layer for a fuse.

To accomplish the second object, the present invention in manufacturing method of a semiconductor integrated circuit device in which multiple interconnection metal layers are connected through a via comprises steps of consecutively forming a metal layer for a fuse and a interconnection metal layer on the via; forming a first passivation layer on the interconnection metal layer; patterning the first passivation layer to define a fuse opening area which is positioned more than twice the thickness of the interconnection metal layer from the via; and forming a fuse area by exposing the metal layer for a fuse by wet etching the interconnection metal layer using the first passivation layer as a mask.

Preferably, after forming the first passivation layer, a second passivation layer is formed on the first passivation layer and the second and first passivation layers are patterned to define a fuse area.

Preferably, after the step of forming a fuse area by exposing a metal layer, a second passivation layer is formed on the resulting structure.

Preferably, the first passivation layer is composed of an oxide and the second passivation layer is composed of a nitride.

Preferably, the thickness of the first passivation layer is greater than 3000 Å. Preferably, the thickness of the second passivation layer is less than 8000 Å.

BRIEF DESCRIPTION OF THE DRAWINGS

A more complete appreciation of this invention will be readily apparent as the same becomes better understood by reference to the following detailed description when considered in conjunction with the accompanying drawings, in which like reference symbols indicate the same or similar components, in which.

DETAILED DESCRIPTION OF THE PREFERRED EMBODIMENT

The present invention will now be described more fully hereinafter with reference to the accompanying drawings in which preferred embodiment of the invention is shown.

Figure 1:
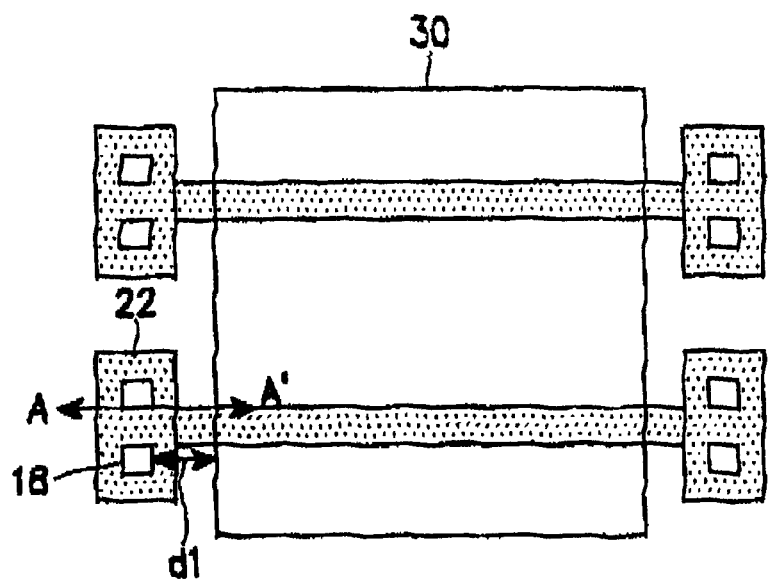
FIG. 1 is a plan view illustrating a fuse area in a conventional semiconductor integrated circuit device.
Figure 2:
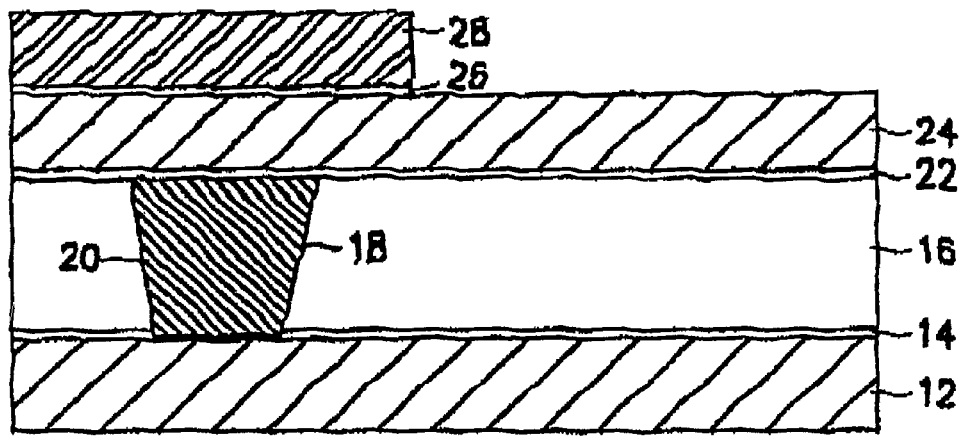
FIG. 2 and FIG. 3 are cross-sectional views taken along line A–A' in FIG. 1 for illustrating a step of forming a fuse in a conventional semiconductor integrated circuit device.
Figure 3:
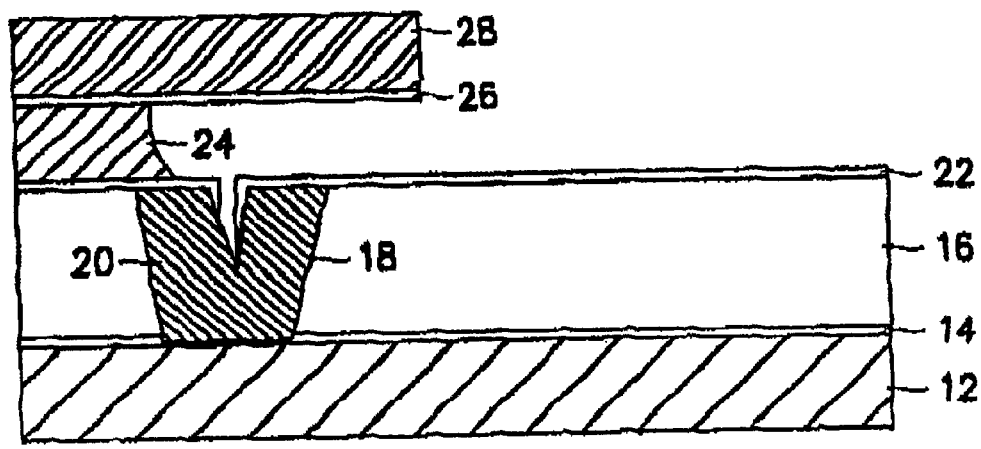
Figure 4:
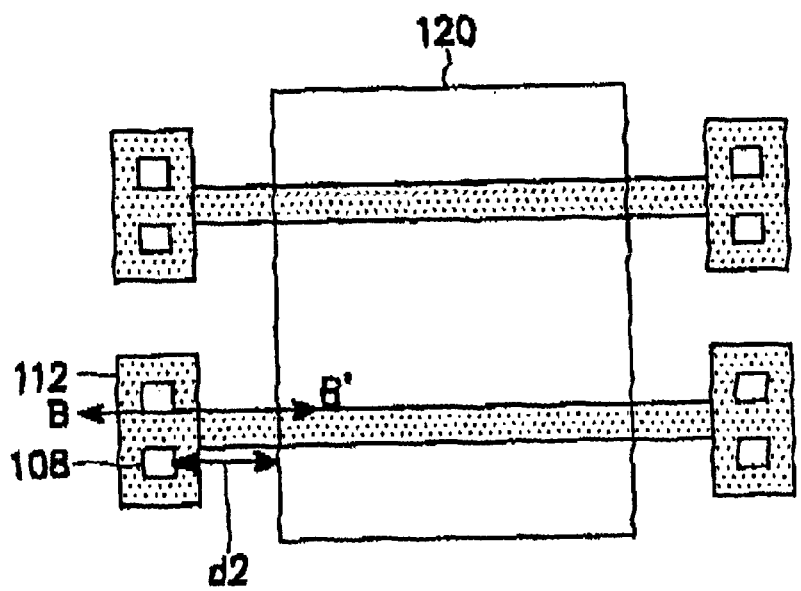
FIG. 4 is a plan view illustrating a fuse area in a semiconductor integrated circuit device in accordance with the present invention.
Figure 5:
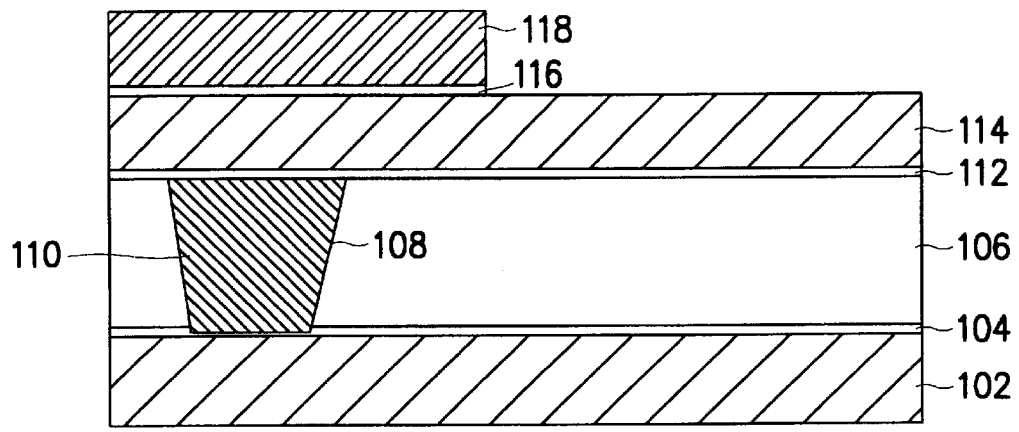
FIG. 5 and FIG. 6 are cross-sectional views taken along line B–B' in FIG. 4 illustrating a step of forming a fuse in a semiconductor integrated circuit device in accordance with a first embodiment of the present invention.
Figure 6:
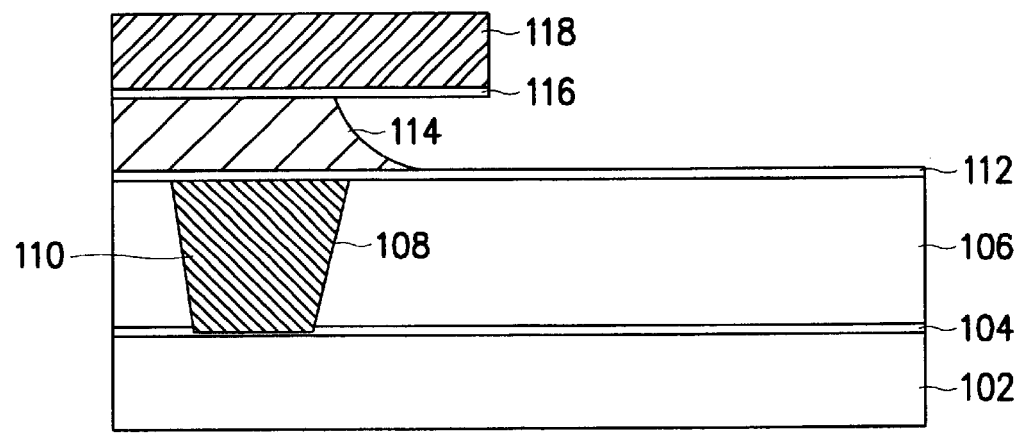

FIG. 4 is a plan view illustrating a fuse area in a semiconductor integrated circuit device in accordance with the present invention. FIG. 5 and FIG. 6 are cross-sectional views taken along line B–B' in FIG. 4 illustrating a step of forming a fuse in a semiconductor integrated circuit device in accordance with a first embodiment of the present invention.

Referring to FIG. 5, after depositing an aluminium (Al) layer for an interconnection metal layer, and consequently depositing a titanium (Ti) layer and a titanium nitride (TiN) layer for a barrier layer on an insulation layer (not shown) formed on a semiconductor substrate (not shown) in which a certain configuration of circuits is formed, a lower interconnection metal layer (102) and a first barrier metal layer (104) is formed by patterning the titanium nitride layer, the titanium layer, and the aluminium layer using a photo-etching process. After forming an inter-metal dielectric layer (106), which is formed of an insulation material such as an oxide, on the first barrier metal layer (104), a via (108), exposing a portion of the surface of the lower interconnection metal layer (102), is formed by photo-etching of the inter-metal dielectric layer (106). Thereafter, a metal layer such as a tungsten (W) layer is deposited thick enough to fill up the via (108) by chemical vapor deposition (CVD) method. Then, such a tungsten (W) layer is planarized by chemical mechanical polishing (CMP) until the inter-metal dielectric layer (106) is exposed to form a via plug (110).

A titanium (Ti) layer having a thickness of about 150 Å and a titanium nitride (TiN) layer having a thickness of about 650 Å are consecutively formed by sputtering or chemical vapor deposition (CVD) method on the inter-metal dielectric layer (106) and the via plug (110), thereby forming a second barrier metal layer (112).

After forming about 6000 Å aluminium (Al) layer on the second barrier metal layer (112), an upper interconnection metal layer (114) is formed by patterning the aluminum layer by photo-etching. The second barrier metal layer (112) prevents an unwanted reaction between tungsten (W) and aluminium (Al). A fuse is formed by exposing the surface of the second barrier metal layer (112) at a certain area. An oxide deposited on the second barrier metal layer by a plasma enhanced chemical vapor deposition (PECVD) method functions as a first passivation layer (116). A second passivation layer (118) is formed by depositing silicon nitride ($Si_3N_4$) on the first passivation layer (116) by plasma enhanced chemical vapor deposition (PECVD).

Subsequently, after applying a photoresist film (not shown) on the second passivation layer (118), a fuse opening area (120) is defined by a photo-etching method as illustrated in FIG. 4. A dry etching of the second passivation layer (118) and the first passivation layer (116) using the patterned photoresist film as a mask is performed. Then, the photoresist film is removed by ashing and stripping method. Here, the distance (d2 in FIG. 4) between the fuse opening area (120) and the via (108) is two to three times the thickness of the interconnection metal layer (114).

Referring to FIG. 6, the fuse area of the second barrier metal layer (112) is exposed by etching using a chemical etchant having a selectivity between the second barrier metal layer (112) and the upper interconnection metal layer (114) and using the patterned second and first passivation layers (118,116) as an etching mask. At this time, the upper interconnection metal layer (114) below the first passivation layer (116) is also etched, but the via plug (110) is not exposed because enough distance (d2 in FIG. 4) is allowed between the fuse opening area (120) and the via (108).

Figure 7:
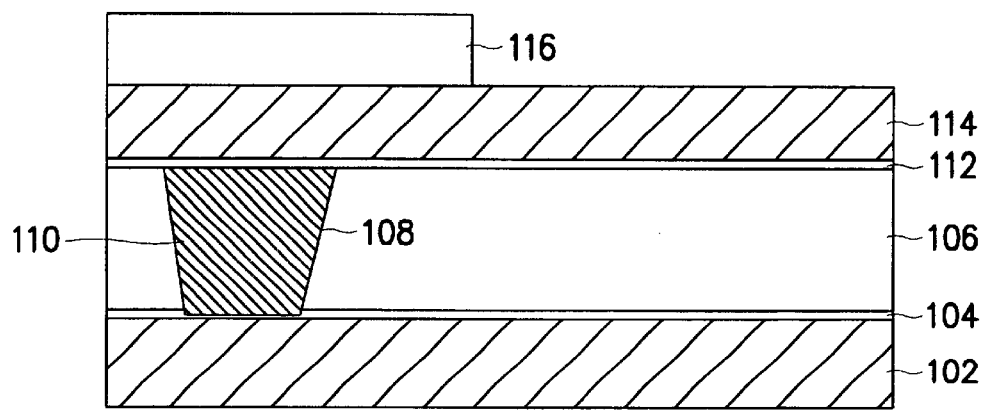
FIG. 7 through FIG. 9 are cross-sectional views taken along line B–B' in FIG. 4 illustrating a step of forming a fuse in a semiconductor integrated circuit device in accordance with a second embodiment of the present invention.
Figure 8:
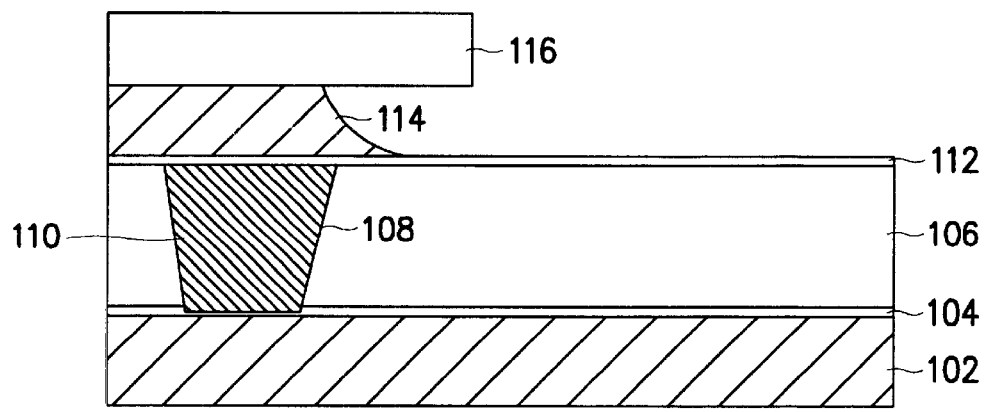
Figure 9:
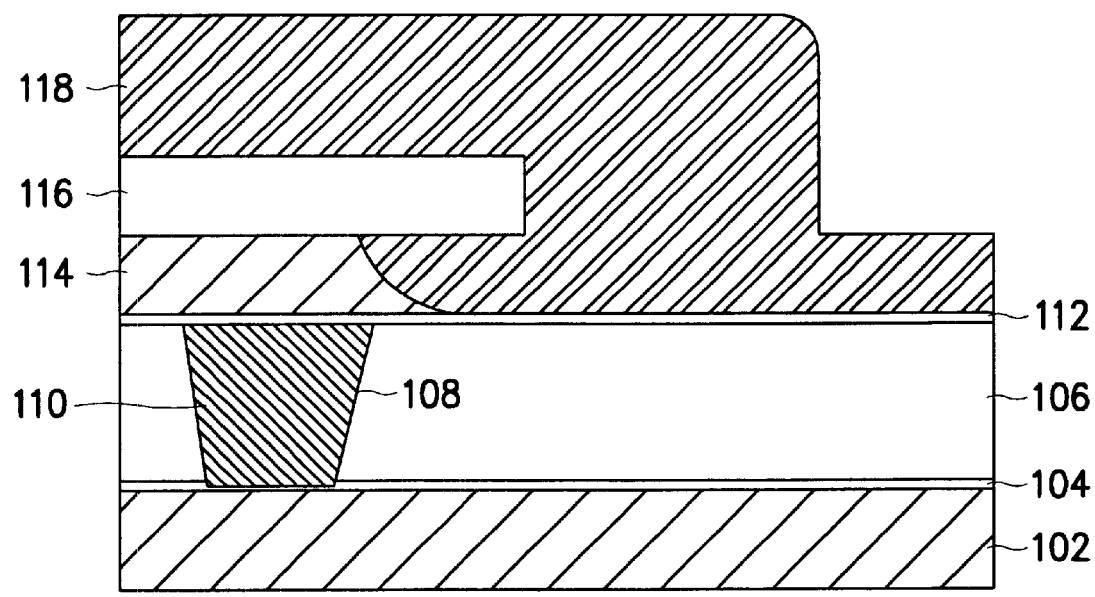

FIG. 7 through FIG. 9 are cross-sectional views taken along line B–B' in FIG. 4 illustrating a step of forming a fuse in a semiconductor integrated circuit device in accordance with a second embodiment of the present invention.

Referring to FIG. 7, after forming a second barrier metal layer (112) and an upper interconnection metal layer (114) by the same method as in the first embodiment of the present invention, an oxide layer is formed to a thickness of greater than 3000 Å by plasma enhanced chemical vapor deposition (PECVD), thereby forming a first passivation layer (116). Next, a photoresist film (not shown) is applied on the first passivation layer (116) and then a fuse opening area (120) is defined by patterning the film. A dry etching of the first passivation layer, using the patterned photoresist film as a mask, is performed. Then, the photoresist film is removed by ashing and stripping. Here, the distance (d2 in FIG. 4) between the fuse opening area (120) and the via (108) is two to three times the thickness of the interconnection metal layer (114).

Referring to FIG. 8, the fuse area of the second barrier metal layer (112) is exposed by chemical etching using a chemical etchant having a selectivity between the second barrier metal layer (112) and the upper interconnection metal layer (114) and using the patterned first passivation layer as a etching mask. At this time, the upper interconnection metal layer (114) below the first passivation layer (116) is also chemically etched. However, because enough distance (d2 in FIG. 4) is allowed between the fuse opening area (120) and the via (108), the via plug (110) is not exposed.

Referring to FIG. 9, a second passivation layer 118 is formed by depositing silicon nitride ($Si_3N_4$) to a thickness of less than 8000 Å by plasma enhanced chemical vapor deposition (PECVD) on a entire surface in which a fuse area is opened. The second passivation layer prevents a short-circuit between adjacent fuses in a subsequent laser repairing process.

As described above in detail, in accordance with the present invention, by having an enough distance between a fuse opening area and a via corresponding to the thickness of the interconnection metal layer, the exposure of the via plug can be avoided during the etching step for opening a fuse area. Accordingly, it is possible to prevent a contact failure which can result from a damage to the via plug in a subsequent stripping step.

Also, a passivation layer formed after opening the fuse area prevents a short-circuit between adjacent fuses in a subsequent laser repairing process.

It will be understood that the embodiment described herein are merely exemplary and that one skilled in the art can make many variations and modifications to the disclosed embodiment without departing from the spirit and scope of the invention. All such variations and modifications are intended to be included within the scope of the invention as defined by the appended claims.

What is claimed is:

1. A method for manufacturing a fuse structure for a semiconductor integrated circuit device in which multiple interconnection metal layers are connected through a via comprises steps of:

sequentially forming a metal barrier layer for a fuse and an interconnection metal layer on said via;

forming a first passivation layer on said interconnection metal layer;

patterning said first passivation layer to define a fuse opening area that is positioned more than twice the thickness of said interconnection metal layer from said via; and forming a fuse area by exposing said metal barrier layer for a fuse by wet etching said interconnection metal layer using said first passivation layer as a mask.

2. A method for manufacturing a semiconductor integrated circuit device according to claim 1, wherein said metal barrier layer for a fuse is composed of titanium (Ti) and titanium nitride (TiN).

3. A method for manufacturing a semiconductor integrated circuit device according to claim 1, wherein a wet etching of said interconnection metal barrier layer is performed using a chemical etchant having a selectivity between said metal barrier layer and said interconnection metal layer.

4. A method for manufacturing a semiconductor integrated circuit device according to claim 1, wherein the thickness of said first passivation layer is greater than 3000 Å.

5. A method for manufacturing a semiconductor integrated circuit device according to claim 1, after forming said fuse area, further comprising forming a second passivation layer.

6. A method for manufacturing a semiconductor integrated circuit device according to claim 1, after the step of forming said first passivation layer, further comprising forming a second passivation layer on said first passivation layer.

7. A method for manufacturing a semiconductor integrated circuit device according to claim 5, said second passivation layer is composed of a nitride.

8. A method for manufacturing a semiconductor integrated circuit device according to claim 6, said second passivation layer is composed of a nitride.

9. A method for manufacturing a semiconductor integrated circuit device according to claim 5, the thickness of said second passivation layer is less than 8000 Å.

10. A method for manufacturing a semiconductor integrated circuit device according to claim 6, the thickness of said second passivation layer is less than 8000 Å.

* * * * *